(12) United States Patent
Fan

(10) Patent No.: US 7,896,677 B2
(45) Date of Patent: Mar. 1, 2011

(54) ELECTRICAL CONNECTOR HAVING IMPROVED INTERCONNECTING ARRANGEMENT BETWEEN LOAD PLATE AND STIFFENER

(75) Inventor: Chia-Wei Fan, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/547,507

(22) Filed: Aug. 26, 2009

(65) Prior Publication Data

US 2010/0055932 A1 Mar. 4, 2010

(30) Foreign Application Priority Data

Aug. 26, 2008 (CN) .............................. 09 7 215278

(51) Int. Cl.
*H01R 13/62* (2006.01)

(52) U.S. Cl. ......................................... 439/331; 439/73

(58) Field of Classification Search ............. 439/70–73, 439/331

See application file for complete search history.

(56) References Cited

U.S. PATENT DOCUMENTS

| | | | |
|---|---|---|---|
| 6,695,635 B1 * | 2/2004 | Lai ............................ | 439/342 |
| 6,916,195 B2 | 7/2005 | Byquist | |
| 6,971,902 B2 | 12/2005 | Taylor et al. | |
| 7,517,229 B2 * | 4/2009 | Ma .............................. | 439/73 |
| 7,553,178 B1 * | 6/2009 | Wertz et al. ................. | 439/331 |
| 7,575,461 B2 * | 8/2009 | Fan ............................ | 439/331 |

FOREIGN PATENT DOCUMENTS

TW  M260040  3/2005

\* cited by examiner

*Primary Examiner*—Truc T Nguyen
(74) *Attorney, Agent, or Firm*—Andrew C. Cheng; Wei Te Chung; Ming Chieh Chang

(57) ABSTRACT

An electrical connector for receiving an IC package includes an insulative housing, a plurality of contacts received in the insulative housing, a stiffener surrounding the insulative housing and a load plate pivotally connected to the stiffener and movable between an opened position and a closed position. The load plate has a shaft and an abutting portion. The stiffener has a connecting member comprising an insertion opening for the shaft, a cavity communicated with the insertion opening for rotation of the shaft, and a supporting portion engaging with the abutting portion to keep the load plate in the opened position with a predetermined angle.

9 Claims, 8 Drawing Sheets

ELECTRICAL CONNECTOR HAVING IMPROVED INTERCONNECTING ARRANGEMENT BETWEEN LOAD PLATE AND STIFFENER

BACKGROUND OF THE INVENTION

1. Field of the Invention

The present invention relates to an electrical connector, and more particularly to an electrical connector having a stiffener and a load plate which are interconnected by an improved interconnecting arrangement.

2. Description of Related Art

Electrical connectors are widely used for mounted on a printed circuit board to electrically connect an IC package. Taiwanese Utility Patent No. M260040 discloses a type of electrical connector mounted on a printed circuit board for receiving an IC package. Referring to FIGS. 3-5 of this patent, the electrical connector includes an insulative housing, a stiffener surrounding the housing and a metallic load plate pivotally connecting with the stiffener. The load plate is able to be operated manually between a closed position and an opened position. The stiffener has a plurality of side walls extending upward, one of which is formed with a pair of connecting holes. Correspondingly, the load plate has a pair of arched clasps respectively hinged to the connecting holes. Between the pair of the clasps is a stopping tab which serves to abut against with the stiffener to keep the load plate positioned stationary at a selected angle after the opening of the load plate.

However, the stopping tab and the clasps are substantially located in a same line, and needed to be respectively lactated by opposite sides of the side wall of the stiffener when the load plate is assembled to the stiffener. As a result, at least one of the clasps and the stopping tab has to deform properly to facilitate the assembling process. In addition, the friction produced between the stiffener and the clasps or the stopping tab is likely to damage the plated layers on the stiffener or the load plate.

In view of the above, a new electrical connector capable of reducing deformation thereof is needed.

SUMMARY OF THE INVENTION

Accordingly, an object of the present invention is to provide an electrical connector capable of reducing deformation thereof.

To achieve the above object, an electrical connector for receiving an IC package is provided. The electrical connector includes an insulative housing, a plurality of contacts received in the insulative housing, a stiffener surrounding the insulative housing and a load plate pivotally connected to the stiffener and movable between an opened position and a closed position. The load plate has a shaft and an abutting portion. The stiffener has a connecting member comprising an insertion opening for the shaft, and cavity communicated with the insertion opening for rotation of the shaft, and a supporting portion engaging with the abutting portion to keep the load plate in the opened position with a predetermined angle.

Other objects, advantages and novel features of the invention will become more apparent from the following detailed description when taken in conjunction with the accompanying drawings, in which:

DETAILED DESCRIPTION OF THE INVENTION

Figure 1:
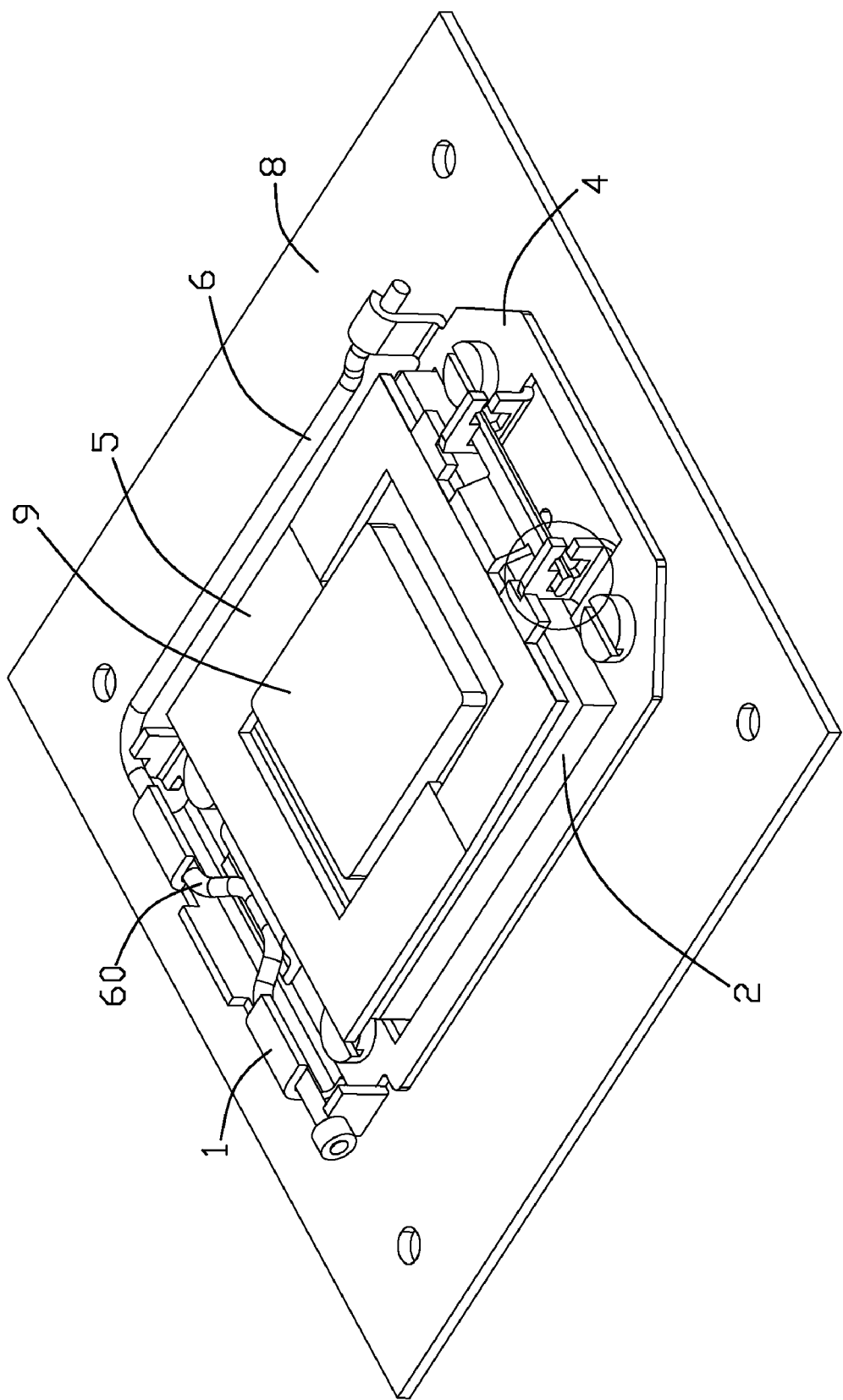
FIG. 1 is an assembled, perspective view of an electrical connector mounted on a printed circuit board with an IC package received therein, made in accordance with a preferred embodiment of the present invention.
Figure 2:
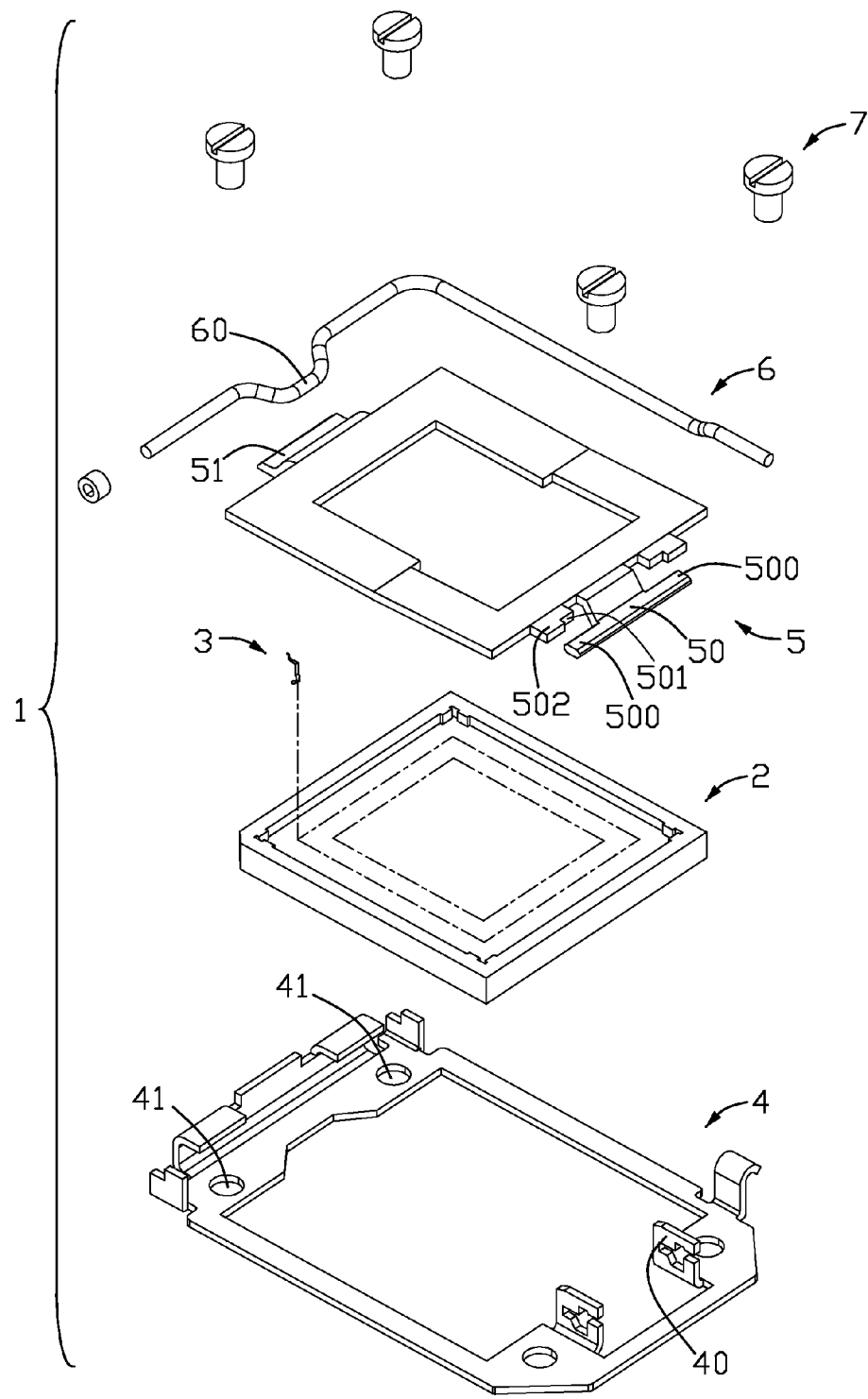
FIG. 2 is an explored, perspective view of the electrical connector, made in accordance with the preferred embodiment of the present invention.
Figure 3:
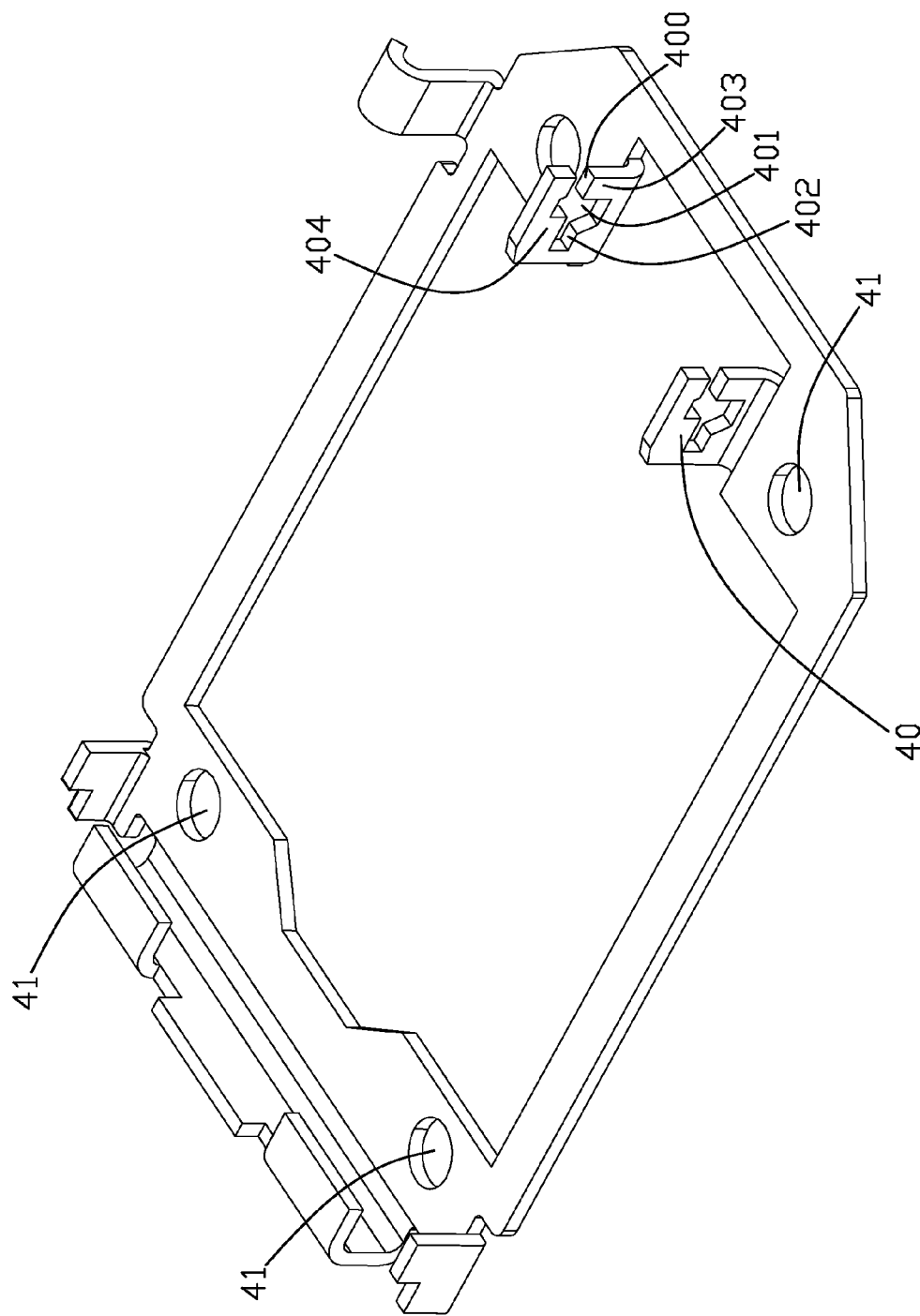
FIG. 3 is a perspective view of a stiffener of the electrical connector, made in accordance with the preferred embodiment of the present invention.

Reference will now be made to the drawings to describe the present invention in detail.

Referring to FIGS. 1-5, the electrical connector 1 according the a preferred embodiment of the present invention is generally mounted on a printed circuit board 8 to receive an IC package 9 therein. The electrical connector 1 includes an insulative housing 2, a plurality of contacts 3 received in the insulative housing 2, a stiffener 4 surrounding the insulative housing 2, and a load plate 5 pivotally connected to the stiffener 4. The load plate 5 is movable between an opened position and a closed poison, and an L-shaped load lever 6 mounted on the stiffener 4 is employed to lock the load plate 5 when the load plate 5 is disposed in the closed position.

The stiffener 4 has a frame structure and surrounds the insulative housing 2. A first end of the stiffener 4 is connected to the load plate 5 while an opposite second end is connected to the load lever 6, wherein the first end is integrally formed with a pair of connecting members 40 extending upward and perpendicular to the stiffener 4. The connecting member 40 includes a horizontal insertion opening 400, a cavity 401 communicated with the insertion opening 400, and a containing slot 402 communicated with the cavity 401. The width of the cavity 401 is bigger than that of the insertion opening 400 and the containing slot 402. Under the insertion opening 400 and beside the cavity 401 is a supporting portion 403 which extends from the connecting member 40. A stopping portion 404 extends from the connecting member 40 and is located above the cavity 401. The detailed engagement between the stiffener 4 and the load plate 5 will be explained in the follow description. Both of the opposite ends of the stiffener 4 that respectively connected to the load plate 5 and the load lever 6 are configured with a pair of holes 41 engaging with screws 7 so as to lock the stiffener 4 onto the printed circuit board 8.

The load plate 5 also has a substantial frame structure, one end of which is provided with a connecting portion 50 and an opposite end is provided with a tongue portion 51. The load lever 6 is provided with a pressing portion 60 capable of pressing the tongue portion 51 so as to lock the load plate 5 into the closed position. A shaft 500 extends outwardly from two ends of the connecting portion 50. An abutting portion 501 and a limiting portion 502 are formed at each of two opposite sides of the connecting portion 50 and located at some edge of the load plate 5 as the connecting portion 50.

Figure 4:
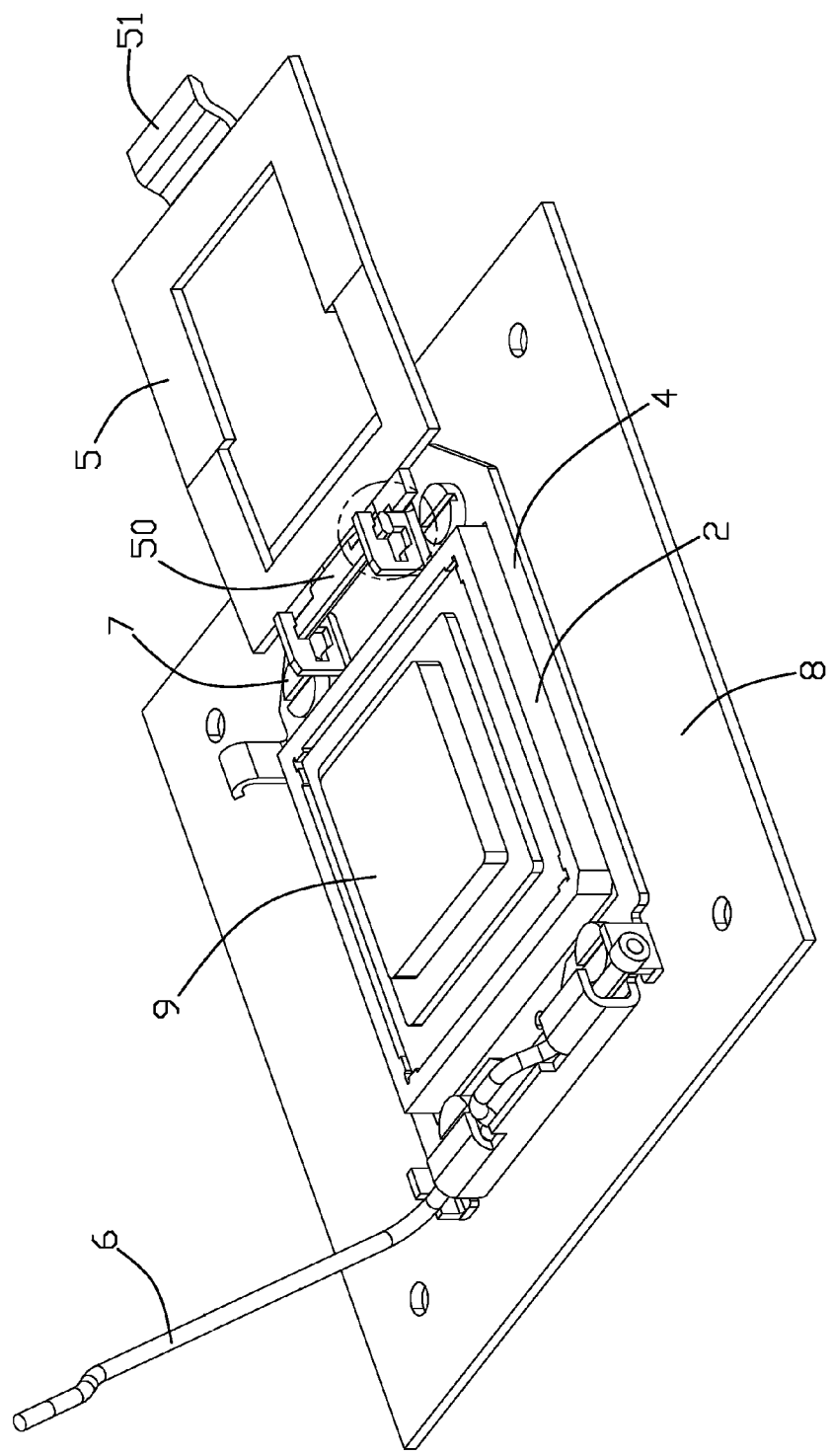
FIG. 4 is an assembled, perspective view of the electrical connector made in accordance with the preferred embodiment of the present invention, wherein a load plate thereof is disposed in a horizontal position.
Figure 6:
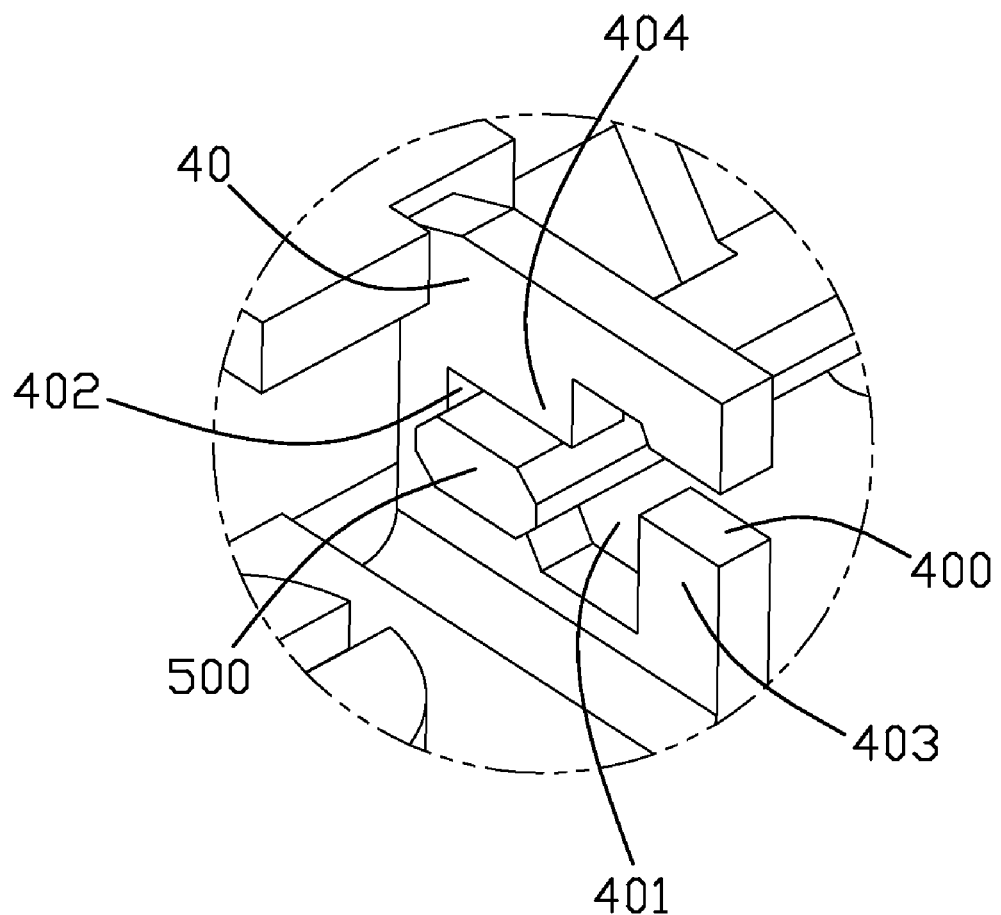
FIG. 6 is an enlarged view of the part shown in the circle in the FIG. 1.
Figure 7:
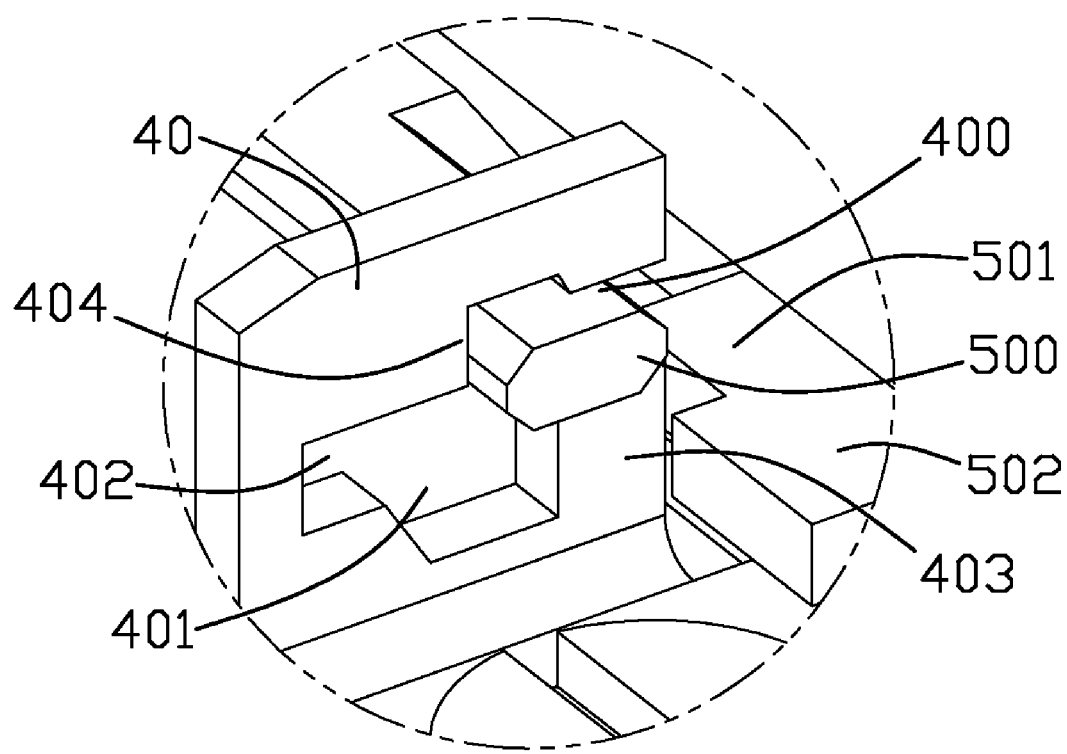
FIG. 7 is an enlarged view of the part shown in the circle in the FIG. 4.

The assembly process of the electrical connector 1 is described as follows. Referring to FIG. 4 and FIG. 7, the load plate 5 is firstly mounted to the stiffener 4 from a horizontal position. For details, the shaft 500 moves transversely through the insertion opening 400 and then get into the cavity 501, until the front edge of the shaft 500 reaches the stopping portion 404. The width of the insertion opening 400 is a little larger than the thickness of the shaft 500. Secondly, referring to FIG. 1 and FIG. 6, rotate the load plate 5 and allow the shaft 500 to rotate in the cavity 401 until the load plate 5 substantially gets to a horizontal position and covers the insulative housing 2. The load plate 5 is then moved transversely and slightly toward the load lever 6, allowing the shaft 500 to reach the containing slot 402. Finally, rotate the load lever 6 and enable the pressing portion 60 to press the tongue portion 51 of the load plate 5 so that the load plate 5 is reliably locked into the closed position.

Figure 5:
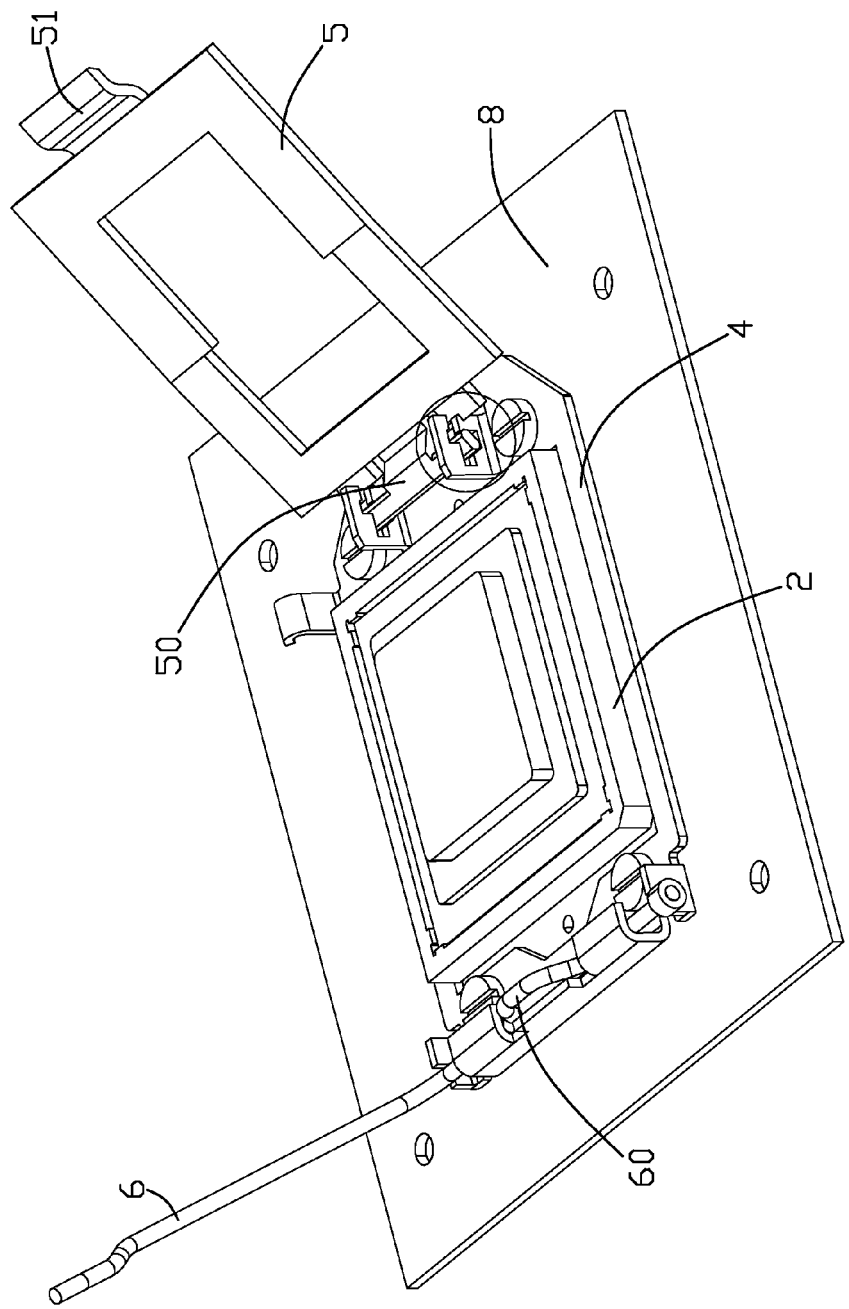
FIG. 5 is an assembled, perspective view of the electrical connector made in accordance with the preferred embodiment of the present invention, wherein the load plate is disposed in an opened position.
Figure 8:
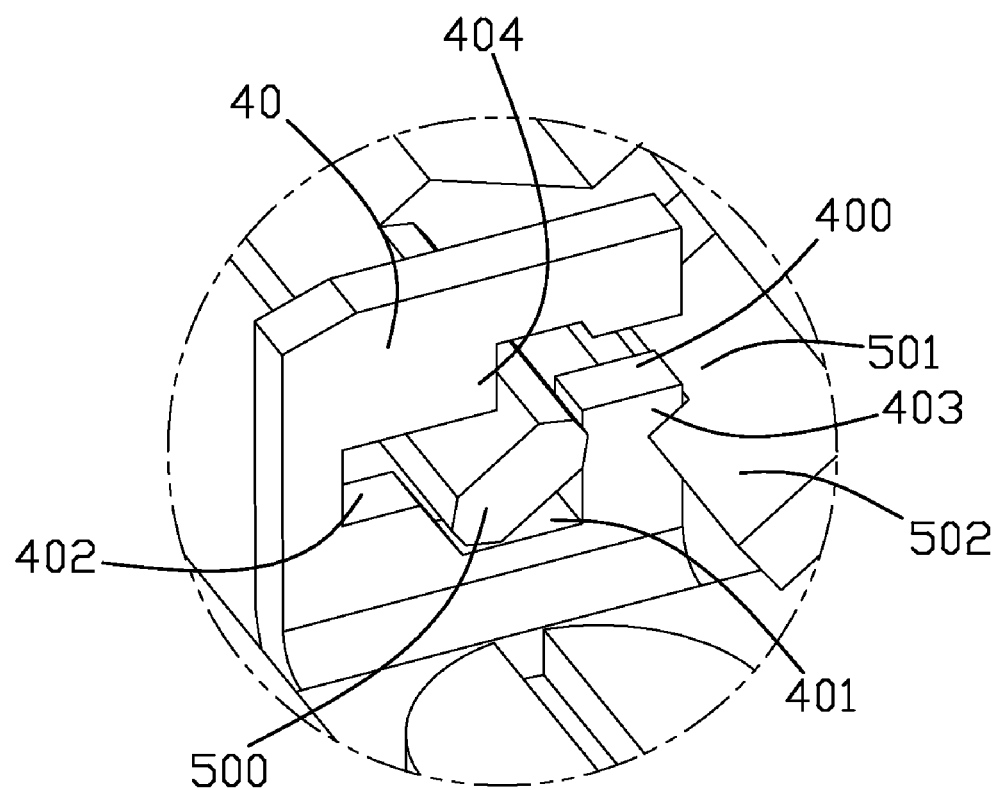
FIG. 8 is an enlarged view of the part shown in the circle in the FIG. 5.

Referring to FIG. 5 and FIG. 8, when the load plate 5 is displaced into the opened position, firstly release the load lever 6 and move the load plate 5 transversely and slightly away from the load lever 6, allowing the shaft 500 to get out of the containing slot 402. Secondly rotate the load plate 5 upwardly and rearward with the shaft 500 rotating in the cavity 401, until the shaft 500 abuts against the stopping portion 404 of the connecting member 40. Simultaneously, the abutting portion 501 of the load plate 5 abuts against the supporting portion 403 of the stiffener 4. Therefore, the load plate 5 is reliably disposed in the opened position with a predetermined angle due to the engagement between the stopping portion 404 and the shaft 500 and the engagement between the abutting portion 501 and the supporting portion 403 as well. In addition, since the cavity 401 and insertion opening 400 define a height offset due to the width difference, the shaft 500 is difficult to slide out of the cavity 401 freely. Consequently, due to the engagement between the connecting portion 50 and the connecting member 40, the load plate 5 is easy to be assembled to the stiffener 4 while not likely to freely escape away from the stiffener 4. In addition, the shaft 500 is formed with oblique surfaces (not labeled) at angles thereof so as to facilitate the rotation of the shaft 500 in the cavity 401. The limiting portions 502 are respectively located at outer sides of the connecting members 40 so that the load plate 5 is limited in a length direction of the shaft 500.

The load plate 5 will not produce substantial friction with the stiffener no matter in the mounting process or in the opening process, thereby preventing deformation of the load plate 5 and the stiffener 4, and preventing the plated layers thereof being damaged as well.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for receiving an IC package, comprising:
    an insulative housing;
    a plurality of contacts received in the insulative housing;
    a stiffener surrounding the insulative housing; and
    a load plate pivotally connected to the stiffener and movable between an opened position and a closed position;
    wherein the load plate has a shaft and an abutting portion, and the stiffener has a connecting member comprising an insertion opening for the shaft, a cavity communicated with the insertion opening for rotation of the shaft, and a supporting portion engaging with the abutting portion to keep the load plate in the opened position with a predetermined angle;
    wherein the load plate has a connecting portion extending from one edge thereof and the shaft is extending from two ends of the connecting portion;
    wherein the shaft and the abutting portion extend from same edge of the load plate;
    wherein the stiffener comprises a pair of said connecting members respectively extending upward perpendicular to the stiffener.

2. The electrical connector as claimed in claim 1, wherein the width of the insertion opening is smaller than that of the cavity so as to define an offset in the height direction.

3. The electrical connector as claimed in claim 1, wherein the connecting member defines a containing slot communicated with the cavity, the shaft being located in the containing slot when the load plate is in a closed position.

4. The electrical connector as claimed in claim 1, wherein the connecting member has a stopping portion above the cavity to engage with the shaft so as to limit the rotation of the load plate.

5. The electrical connector as claimed in claim 1, wherein the load plate is provided with a limiting portion located at outer side of the connecting member so that the load plate is limited in a length direction of the shaft.

6. An electrical connector for receiving an IC package, comprising:
    an insulative housing;
    a plurality of contacts received in the insulative housing;
    a stiffener surrounding the insulative housing and having a connecting member; and
    a load plate pivotally connected to the stiffener and movable between an opened position and a closed position, the load plate having a shaft;
    wherein the connecting member has an insertion opening for the shaft and a cavity communicated with the insertion opening, the cavity has bigger width than the insertion opening so that a height offset is defined therebetween, the shaft rotating in the cavity but not moving out of the cavity due to the height offset when the load plate moves from the closed position to the opened position;
    wherein the connecting member defines a containing slot communicated with the cavity, the shaft being located in the containing slot when the load plate is disposed in the closed position.

7. The electrical connector as claimed in claim 6, wherein the load plate has an abutting portion and the stiffener has a supporting portion engaging with the abutting portion so as to keep the load plate in the opened position.

8. The electrical connector as claimed in claim 6, wherein the connecting member has a stopping portion above the cavity to engage with the shaft so as to limit the rotation of the load plate.

9. The electrical connector as claimed in claim 6, wherein the shaft is formed with oblique surfaces at angles thereof so as to facilitate the rotation of the shaft in the cavity.

* * * * *